United States Patent
Suzuki

(10) Patent No.: US 9,368,363 B2
(45) Date of Patent: Jun. 14, 2016

(54) ETCHING GAS AND ETCHING METHOD

(75) Inventor: Takefumi Suzuki, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 0 days.

(21) Appl. No.: 14/005,483

(22) PCT Filed: Mar. 14, 2012

(86) PCT No.: PCT/JP2012/056529
§ 371 (c)(1),
(2), (4) Date: Nov. 25, 2013

(87) PCT Pub. No.: WO2012/124726
PCT Pub. Date: Sep. 20, 2012

(65) Prior Publication Data
US 2014/0073139 A1    Mar. 13, 2014

(30) Foreign Application Priority Data

Mar. 17, 2011    (JP) .................................. 2011-058800

(51) Int. Cl.
*H01L 21/302*    (2006.01)
*H01L 21/3065*   (2006.01)
*H01L 21/311*    (2006.01)

(52) U.S. Cl.
CPC ...... *H01L 21/3065* (2013.01); *H01L 21/31116* (2013.01); *H01L 21/31138* (2013.01)

(58) Field of Classification Search
CPC ..................... H01L 21/3065; H01L 21/31105; H01L 21/3144; H01L 21/3116; H01L 21/3081; H01L 21/31138; C23F 1/12; C09K 13/08; C09K 13/10
USPC ............... 252/79.1, 79.2, 79.3; 438/706, 710, 438/714, 723, 725
See application file for complete search history.

(56) References Cited

U.S. PATENT DOCUMENTS

| | | | |
|---|---|---|---|
| 7,183,219 B1* | 2/2007 | Hama ............... | H01L 21/31116 252/79.1 |
| 2004/0011763 A1* | 1/2004 | Hirose et al. ..................... | 216/41 |
| 2008/0191163 A1* | 8/2008 | Mocella ................. | C07C 21/18 252/79.1 |
| 2009/0023863 A1* | 1/2009 | Kanega et al. ................ | 525/200 |
| 2010/0264116 A1 | 10/2010 | Suzuki et al. | |
| 2011/0041878 A1* | 2/2011 | Nappa et al. .................... | 134/19 |

FOREIGN PATENT DOCUMENTS

| | | |
|---|---|---|
| JP | 05-152255 A | 6/1993 |
| JP | 10-209122 A | 8/1998 |
| JP | 2006-108484 A | 4/2006 |
| WO | 02/21586 A1 | 3/2002 |
| WO | 2009/041560 A1 | 4/2009 |

OTHER PUBLICATIONS www.scbt.com . Santa Cruz Biotechnology Catalogue, 2-bromo-1,2,2-trifluoroethyl trifluoromethyl ether(CAS 2356-55-0). 2007-2015.*
International Search Report dated May 29, 2012, issued in corresponding application No. PCT/JP2012/056529.

* cited by examiner

*Primary Examiner* — Lan Vinh
(74) *Attorney, Agent, or Firm* — Westerman, Hattori, Daniels & Adrian, LLP

(57) ABSTRACT

The present invention is a plasma etching gas comprising a fluorocarbon having 3 or 4 carbon atoms, the fluorocarbon including at least one unsaturated bond and/or ether linkage, and including a bromine atom, and a plasma etching method comprising subjecting a silicon oxide film on a substrate to plasma etching through a mask using a process gas, the process gas being the plasma etching gas. This plasma etching gas exhibits excellent etching selectivity, and has a short atmospheric lifetime and a low environmental impact. This plasma etching method makes it possible to selectively subject a silicon oxide film to plasma etching at a high etching rate without causing an increase in surface roughness.

2 Claims, No Drawings

ETCHING GAS AND ETCHING METHOD

TECHNICAL FIELD

The invention relates to an etching gas that is used to subject a silicon oxide film on a substrate to plasma etching, and an etching method that utilizes the etching gas.

BACKGROUND ART

When producing a semiconductor device, a silicon-containing dielectric layer (e.g., $SiO_2$ film or SiOC film) may be subjected to plasma etching using an organic film layer (e.g., photoresist) as a mask to form a contact hole and the like.

A halogen-based gas (halogen=F, I, and/or Br) that includes a fluorocarbon compound in which the atomic ratio of at least one of I and Br is 26% or less based on the total halogen content and the remainder is F, has been proposed as a process gas (etching gas) used for plasma etching (see Patent Document 1). Patent Document 1 states that damage to the resist mask can be reduced by utilizing such a halogen-based gas.

However, the halogen-based gas specifically disclosed in Patent Document 1 is a saturated compound having a long atmospheric lifetime, and lacks environmental acceptability.

Since hydrogen bromide has a sidewall protection effect, a multi-step etching technique that performs etching using hydrogen bromide before and after an etching step that utilizes fluorine gas has been widely employed.

However, a single-step plasma etching technique that utilizes a single process gas is preferable from the viewpoint of productivity as compared with a multi-step etching technique that selectively utilizes a plurality of process gases.

Since hydrogen bromide has an effect of promoting deposition of a carbon-based polymer, a plasma etching technique that utilizes hydrogen bromide in combination with a fluorocarbon (e.g., $C_4F_8$) has also been studied (see Patent Document 2).

However, the above method poses various problems (e.g., hydrogen bromide has corrosiveness to a metal and the like, and the complexity of the production process increases since it is important to control the mixing ratio of hydrogen bromide to the fluorocarbon) when industrially producing a semiconductor device or the like using the above method.

A technique that utilizes a fluorinated hydrocarbon gas in order to form a contact hole having a good shape using a single process gas has also been proposed (see Patent Document 3).

RELATED-ART DOCUMENT

Patent Document

Patent Document 1: JP-A-2006-108484
Patent Document 2: JP-A-10-209122
Patent Document 3: WO2009/041560 (U.S.2010/0264116 A1)

SUMMARY OF THE INVENTION

Technical Problem

An object of the invention is to provide a plasma etching gas that exhibits excellent etching selectivity, and has a short atmospheric lifetime and a low environmental impact, and a plasma etching method that can selectively etch a silicon oxide film in one step without using hydrogen bromide.

Solution to Problem

A first aspect of the invention provides the following plasma etching gas (see (1) to (3)).
(1) A plasma etching gas including a fluorocarbon having 3 or 4 carbon atoms, the fluorocarbon including at least one unsaturated bond and/or ether linkage, and including a bromine atom.
(2) The plasma etching gas according to (1), wherein the fluorocarbon is a compound that satisfies the expressions "number of bromine atoms/number of carbon atoms<1" and "number of hydrogen atoms/number of fluorine atoms<1".
(3) The plasma etching gas according to (1), wherein the fluorocarbon has a boiling point of 60° C. or less.

A second aspect of the invention provides the following plasma etching method (see (4)).
(4) A plasma etching method including subjecting a silicon oxide film on a substrate to plasma etching through a mask using a process gas, the process gas being the plasma etching gas according to any one of (1) to (3).

Advantageous Effects of the Invention

The first aspect of the invention thus provides a plasma etching gas that exhibits excellent etching selectivity, and has a short atmospheric lifetime and a low environmental impact.

The plasma etching gas makes it possible to selectively subject a silicon oxide film to plasma etching at a high etching rate without causing an increase in surface roughness.

DESCRIPTION OF EMBODIMENTS

A plasma etching gas and a plasma etching method according to the embodiments of the invention are described in detail below.

1) Plasma Etching Gas

A plasma etching gas according to one embodiment of the invention includes a fluorocarbon having 3 or 4 carbon atoms, the fluorocarbon including at least one unsaturated bond and/or ether linkage, and including a bromine atom (hereinafter may be referred to as "fluorocarbon A").

The term "etching" used herein refers to a technique that etches a processing target used when producing a semiconductor device or the like to form a highly integrated fine pattern. The term "plasma etching" used herein refers to a technique that causes a glow discharge by applying a high-frequency electric field to a process gas to decompose the gaseous compound into chemically active ions, electrons, and radicals, and implements etching by utilizing chemical reactions with the ions, electrons, and radicals.

Since the fluorocarbon A includes at least an unsaturated bond or an ether linkage, it is possible to obtain a plasma etching gas that has a low environmental impact.

Since the fluorocarbon A includes a bromine atom, and has 3 or 4 carbon atoms, it is possible to obtain a plasma etching gas that has a preferable boiling point, and can selectively subject a silicon oxide film to plasma etching at a high etching rate without causing an increase in surface roughness.

It is preferable that the fluorocarbon A be a compound that satisfies the expressions "number of bromine atoms/number of carbon atoms<1" and "number of hydrogen atoms/number of fluorine atoms<1". A compound that satisfies the expression "number of bromine atoms/number of carbon atoms<1"

normally has a low boiling point, and facilitates handling when introducing the etching gas into an etching apparatus. A compound that satisfies the expression "number of hydrogen atoms/number of fluorine atoms<1" suppresses a situation in which fluorine atoms are trapped by hydrogen atoms.

Examples of such a preferable fluorocarbon A include unsaturated fluorocarbons having 3 or 4 carbon atoms that include one unsaturated bond and a bromine atom, such as 1-bromopentafluoropropene, 2-bromopentafluoropropene, 3-bromopentafluoropropene, 2,3-dibromo-1,1,3,3-tetrafluoropropene, 1-bromo-2,3,3,3-tetrafluoropropene, 2-bromo-1,3,3,3-tetrafluoropropene, 3-bromo-1,1,3,3-tetrafluoropropene, 1,2-dibromo-3,3,3-trifluoropropene, E-1-bromo-3,3,3-trifluoropropene, Z-1-bromo-3,3,3-trifluoropropene, 2-bromo-3,3,3-trifluoropropene, 3-bromo-2,3,3-trifluoropropene, 1,4-dibromohexafluoro-2-butene, 2,3-dibromohexafluoro-2-butene, 2-bromo-1,1,1,4,4,4-hexafluoro-2-butene, 1-bromo-2-(trifluoromethyl)-3,3,3-trifluoropropene, 2-bromo-3,3,4,4,4-pentafluoro-1-butene, Z-1-bromo-2,4,4,4-tetrafluoro-1-butene, 2-bromo-1,1,1,3-tetrafluoro-2-butene, Z-4-bromo-1,1,1,3-tetrafluoro-2-butene, and 4-bromo-3,3,4,4-tetrafluoro-1-butene; fluorocarbons having 3 or 4 carbon atoms that include one ether linkage and a bromine atom, such as 1,2-dibromotrifluoroethyl trifluoromethyl ether, and 2-bromo-1,2,2-trifluoroethyl trifluoromethyl ether; unsaturated fluorocarbons having 3 or 4 carbon atoms that include one unsaturated bond, one ether linkage, and a bromine atom, such as 2-bromotetrafluoroethyl trifluorovinyl ether; and the like.

Among these, fluorocarbons having a boiling point of 60° C. or less are more preferable from the viewpoint of ease of handling and a capability to stably introduce the etching gas into an etching apparatus. Examples of the fluorocarbons having a boiling point of 60° C. or less include 1-bromopentafluoropropene, 2-bromopentafluoropropene, 3-bromopentafluoropropene, 1-bromo-2,3,3,3-tetrafluoropropene, 2-bromo-1,3,3,3-tetrafluoropropene, 3-bromo-1,1,3,3-tetrafluoropropene, E-1-bromo-3,3,3-trifluoropropene, Z-1-bromo-3,3,3-trifluoropropene, 2-bromo-3,3,3-trifluoropropene, 2-bromo-1,1,1,4,4,4-hexafluoro-2-butene, 2-bromo-3,3,4,4,4-pentafluoro-1-butene, 4-bromo-3,3,4,4-tetrafluoro-1-butene, 2-bromo-1,2,2-trifluoroethyl trifluoromethyl ether, 2-bromotetrafluoroethyl trifluorovinyl ether, and the like.

These fluorocarbons A may be used either alone or in combination.

Most of these fluorocarbons A are known substances, and may be produced (obtained) by a known method. A commercially available product may be used either directly or after purification.

For example, 2-bromo-3,3,3-trifluoropropene can be produced by the method described in the Journal of the American Chemical Society, 1951, Vol. 73, 1043.

4-Bromo-3,3,4,4-tetrafluoro-1-butene can be produced by the method described in e-EROS Encyclopedia of Reagents for Organic Synthesis, 2001.

The plasma etching gas according to one embodiment of the invention may include an additional fluorocarbon in combination with the fluorocarbon A. Examples of the additional fluorocarbon include $CF_4$, $CHF_3$, $CH_2F_2$, $C_4F_8$, $C_4F_6$, $C_5F_8$, and the like.

When using the additional fluorocarbon, the additional fluorocarbon is preferably used in a volume ratio of 2 to 50, and more preferably 5 to 20, with respect to the fluorocarbon A.

The plasma etching gas according to one embodiment of the invention may include a noble gas in combination with the fluorocarbon A. Examples of the noble gas include helium gas, neon gas, argon gas, and the like. Among these, argon gas is preferable.

When using the noble gas, the noble gas is preferably used in a volume ratio of 2 to 200, and more preferably 5 to 150, with respect to the fluorocarbon A.

The plasma etching gas according to one embodiment of the invention may include oxygen gas in combination with the fluorocarbon A.

When using the oxygen gas, the oxygen gas is preferably used in a volume ratio of 0.1 to 50, and more preferably 0.5 to 30, with respect to the fluorocarbon A.

Since the plasma etching gas according to one embodiment of the invention includes the fluorocarbon A, the plasma etching gas exhibits excellent etching selectivity, and has a short atmospheric lifetime and a low environmental impact.

Note that the etching selectivity is evaluated using the following expression.

$$\text{(Silicon oxide film etching rate)/(resist film etching rate)} \quad \text{[Expression 1]}$$

2) Plasma Etching Method

A plasma etching method according to one embodiment of the invention includes subjecting a silicon oxide film on a substrate to plasma etching through a mask using the plasma etching gas according to one embodiment of the invention.

The substrate is not particularly limited. An appropriate substrate may be selected depending on the objective. Examples of the substrate include a silicon substrate, a glass substrate, a gallium arsenide substrate, and the like.

The silicon oxide film (etching target) may be formed by an arbitrary method, and may have an arbitrary composition and the like as long as the silicon oxide film is formed of silicon oxide. An appropriate method, composition, and the like may be selected depending on the objective. Examples of the silicon oxide film include an $SiO_2$ film, an SiOC film, and the like.

The mask (etching mask) is not particularly limited. An appropriate mask may be selected depending on the objective. Examples of the mask include an organic film layer and an inorganic film layer.

Examples of the organic film layer include a photoresist layer (e.g., KrF resist, ArF resist, and X-ray resist) and an amorphous carbon layer.

Examples of the inorganic film layer include a nitrogen-containing layer (e.g., $Si_3N_4$ layer) and a silicon layer (e.g., polycrystalline Si layer and amorphous Si layer).

The plasma etching method according to one embodiment of the invention may be implemented using a known plasma etching apparatus. It is preferable to use a reactive ion etching (RIE) apparatus.

Examples of the reactive ion etching apparatus include a helicon wave-type reactive ion etching apparatus, a high frequency induction-type reactive ion etching apparatus, a parallel plate-type reactive ion etching apparatus, a magnetron-type reactive ion etching apparatus, a microwave-type reactive ion etching apparatus, and the like. Among these, a parallel plate-type reactive ion etching apparatus, a high frequency induction-type reactive ion etching apparatus, and a microwave-type reactive ion etching apparatus are preferable since high-density plasma can be easily generated.

The fluorocarbon A and an optional additional gas included in the etching gas may be introduced into the plasma etching apparatus at a rate proportional to the ratio of each component.

The pressure inside the plasma etching apparatus into which the etching gas has been introduced is normally 0.0013 to 1300 Pa, and preferably 0.13 to 5 Pa.

It is preferable to perform etching in a high-density plasma atmosphere in order to ensure that the plasma etching method according to one embodiment of the invention more advantageously achieves its effects. The plasma density is not particularly limited, but is preferably $10^{12}/cm^3$ or more, and more preferably $10^{12}$ to $10^{13}/cm^3$.

When implementing the plasma etching method according to one embodiment of the invention, the temperature of the substrate may optionally be controlled using a cooling system or the like. The temperature of the substrate is not particularly limited, but is preferably −50 to 300° C., more preferably −20 to 200° C., and still more preferably −10 to 100° C.

EXAMPLES

The invention is further described below by way of examples and comparative examples. Note that the invention is not limited to the following examples. The unit "parts" used in the examples and comparative examples refers to "parts by weight" unless otherwise indicated.

Example 1

10 parts of a ternary copolymer obtained using 2,2,2-trifluoromethyl methacrylate, 2-ethyladamantyl methacrylate, and t-butyl methacrylate (copolymerization molar ratio: 2,2,2-trifluoromethyl methacrylate:2-ethyladamantyl methacrylate:t-butyl methacrylate=0.4:0.35:0.25, weight average molecular weight: 8700) and 0.15 parts of triphenylsulfonium methanesulfonate (photoacid generator) were dissolved in 70 parts of propylene glycol monomethyl ether acetate. The solution was filtered through a filter having a pore size of 100 nm to prepare a resist solution.

The resist solution was spin-coated onto an 8-inch silicon substrate on which a silicon oxide film having a thickness of 2 μm was formed. The resulting film was prebaked at 120° C. on a hot plate to form a resist film having a thickness of 18,000 nm. The resist film was exposed through a mask pattern using an X-ray exposure apparatus. The resist film was then post-baked at 130° C., developed at 25° C. for 60 seconds using a 2.38% tetramethylammonium hydroxide aqueous solution, and dried to form a resist pattern having a thickness of 600 nm on the silicon oxide film formed on the surface of the silicon substrate.

The substrate on which the resist pattern was formed was placed in an etching chamber of a parallel plate-type plasma etching apparatus. After evacuating the system, plasma etching was performed under the following conditions using 2-bromo-3,3,3-trifluoropropene ($C_3H_2BrF_3$).
Etching gas: $C_3H_2BrF_3$/Ar/$O_2$=20/200/30 sccm
Pressure: 2.0 Pa (15 mTorr)
Electric power (upper electrode/lower electrode): 1300 W (60 MHz)/400 W (2 MHz)
Electrode-to-electrode distance: 35 mm
Temperature (upper electrode/sidewall/lower electrode): 60/60/0° C.
Etching time: 60 sec Example 2

Plasma etching was performed in the same manner as in Example 1, except that 2-bromo-1,2,2-trifluoroethyl trifluoromethyl ether ($C_3HBrF_6O$) was used instead of 2-bromo-3,3,3-trifluoropropene.

Comparative Example 1

Plasma etching was performed in the same manner as in Example 1, except that tetrafluoromethane ($CF_4$) was used instead of 2-bromo-3,3,3-trifluoropropene.

The etching selectivity and the atmospheric lifetime of each compound used for plasma etching were evaluated as described below. The results are shown in Table 1.
Etching Selectivity The cross section of the wafer subjected to etching was observed using an electron microscope, and the mask (resist film) etching rate and the silicon oxide film etching rate were calculated. The etching selectivity (mask selectivity ratio) was calculated by the above expression. The etching selectivity values of Examples 1 and 2 shown in Table 1 indicate values relative to the etching selectivity value (=100) of Comparative Example 1. A larger etching selectivity value indicates better etching selectivity.
Atmospheric Lifetime The atmospheric lifetime of a compound refers to the time in which the compound is stably present in the atmosphere. The atmospheric lifetime can be estimated from the reactivity with OH radicals and the like. A shorter atmospheric lifetime means that the compound has less environmental impact.

In Table 1, the atmospheric lifetime of the gas used in Example 1 refers to the value described in U.S. Pat. No. 5,759,430.

The atmospheric lifetime of the gas used in Comparative Example 1 refers to the value described in the Technical Summary of the Working Group I Report in the Fourth Assessment Report of the Intergovernmental Panel on Climate Change (IPCC).

The atmospheric lifetime of the gas used in Example 2 was estimated from the atmospheric lifetime of each compound described in the above Technical Summary for the following reasons.
(1) It is suggested from the comparison between $CHF_3$ (270 years) and $CHBrF_2$ (5.8 years) that the atmospheric lifetime decreases when one F is substituted with Br.
(2) It is suggested from the comparison between $CF_3CHFCF_3$ (34.2 years) and $CF_3CHFOCF_3$ (11 years) that the atmospheric lifetime decreases due to an ether structure.
(3) Therefore, it is estimated that the atmospheric lifetime of $CF_2BrCHFOCF_3$ used in Example 2 obtained by substituting F of $CF_3CHFOCF_3$ (11 years) with Br is shorter than 11 years.

TABLE 1

|  | Example 1 | Example 2 | Comparative Example 1 |
|---|---|---|---|
| Mask selectivity ratio | 175 | 123 | 100 |
| Atmospheric lifetime | <1 years | <11 years | 50,000 years |

The invention claimed is:
1. A plasma etching method comprising subjecting a silicon oxide film on a substrate to plasma etching through a mask using a plasma etching gas comprising 2-bromo-3,3,3-trifluoropropene or 2-bromo-1,2,2-trifluoroethyl trifluoromethyl ether.
2. The plasma etching method according to claim 1, wherein the mask is a photoresist layer.

* * * * *